(12) United States Patent
Barnes

(10) Patent No.: US 6,717,443 B2
(45) Date of Patent: Apr. 6, 2004

(54) METHOD AND APPARATUS FOR MITIGATING THE HYSTERESIS EFFECT IN A SENSING CIRCUIT

(75) Inventor: Philip L. Barnes, Plano, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/287,308

(22) Filed: Nov. 4, 2002

(65) Prior Publication Data

US 2003/0052715 A1 Mar. 20, 2003

Related U.S. Application Data

(63) Continuation-in-part of application No. 09/927,673, filed on Aug. 10, 2001, now Pat. No. 6,476,645.

(51) Int. Cl.[7] .................................................. G11C 7/00
(52) U.S. Cl. ............................ 327/51; 327/55; 365/205
(58) Field of Search ............................... 327/50, 51, 73, 327/52, 55; 365/205, 203, 207

(56) References Cited

U.S. PATENT DOCUMENTS 6,608,789 B2 * 8/2003 Sullivan et al. ............... 327/51

* cited by examiner

Primary Examiner—Dinh T. Le

(57) ABSTRACT

A method and apparatus for mitigating the hysteresis effect in a sensing circuit used in the evaluation of a property of a system under test. A state monitor circuit is included for detecting the sensing circuit's state upon evaluating the system's property, e.g., a data out signal level. A feedback control generator is provided for generating a control signal operable to transition the sensing circuit's state to a balanced state, wherein the control signal's logic state is capable of being modified substantially immediately upon completion of the evaluation operation.

19 Claims, 6 Drawing Sheets

METHOD AND APPARATUS FOR MITIGATING THE HYSTERESIS EFFECT IN A SENSING CIRCUIT

CROSS-REFERENCE TO RELATED APPLICATION(S)

This application is a continuation-in-part application of the following patent application(s): "Method And Apparatus For Mitigating The History Effect In A Silicon-On-Insulator (SOI)-Based Circuit," filed Aug. 10, 2001, now U.S. Pat. No. 6,476,645, application Ser. No.: 09/927,673, in the name(s) of Philip L. Barnes, which is (are) hereby incorporated by reference.

BACKGROUND OF THE INVENTION

1. Technical Field of the Invention

The present invention generally relates to electrical circuits. More particularly, and not by way of any limitation, the present invention is directed to a method and apparatus for mitigating the "hysteresis effect" in a sensing circuit.

2. Description of Related Art

Electronic sensing circuits are used for measuring various physical phenomena relating to a system to be evaluated. In general, the sensing circuits may be comprised of one or more decision-making elements (e.g., comparators) and may operate as a multi-state evaluator for sensing the properties of interest upon application of a trigger signal. For example, a data sensing circuit may be used for measuring data logic levels provided by a "data-outputting circuit" such as microprocessor when a clock signal is applied as a trigger.

It is well known that sensing circuits are prone to what is referred to as the "hysteresis" effect, i.e., the lack of retraceability of a circuit's operating curve from one state of operation to another state, which diminishes the circuit's operating sensitivity over time. Consequences of hysteresis can be particularly deleterious in data interface circuitry used in high-speed microprocessor applications.

SUMMARY OF THE INVENTION

Accordingly, the embodiments of the present invention advantageously provide a method and apparatus for mitigating the hysteresis effect in a sensing circuit used in the evaluation of a property of a system under test by minimizing residence time of the sensing circuit in an unbalanced state. A state monitor circuit is included for detecting the sensing circuit's state transition upon evaluating the system's property, e.g., a data out signal level. A feedback control generator is provided for generating a control signal operable to transition the sensing circuit's state to a balanced state, wherein the control signal's logic state is capable of being modified substantially immediately upon completion of the evaluation operation.

BRIEF DESCRIPTION OF THE DRAWINGS

A more complete understanding of the embodiments of the present invention may be had by reference to the following Detailed Description when taken in conjunction with the accompanying drawings wherein.

DETAILED DESCRIPTION OF THE DRAWINGS

Figure 1:
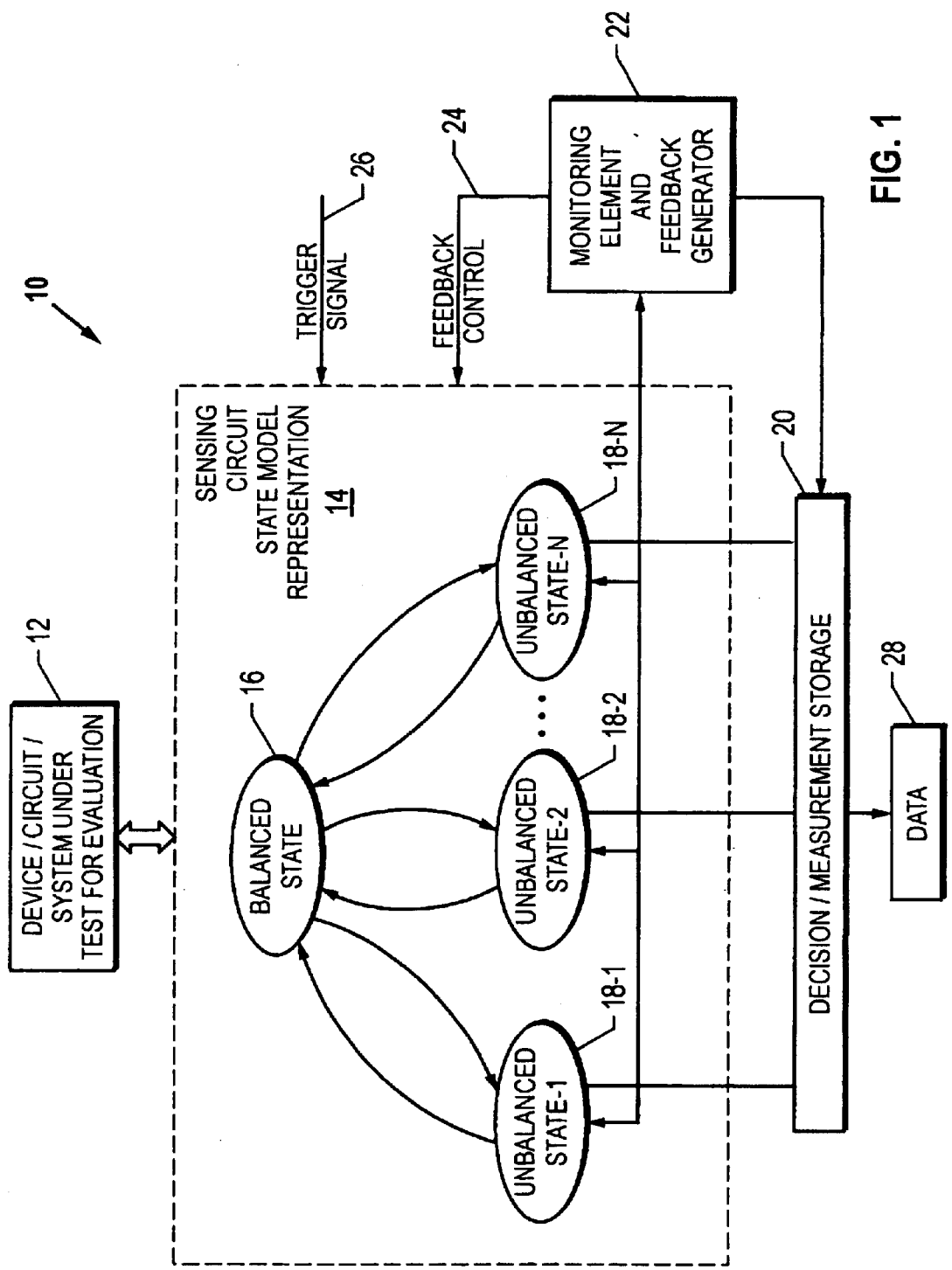
FIG. 1 depicts a functional block diagram of an embodiment of an apparatus for mitigating the hysteresis effect in a sensing circuit in accordance with an embodiment of the present invention.

In the drawings, like or similar elements are designated with identical reference numerals throughout the several views thereof, and the various elements depicted are not necessarily drawn to scale. Referring now to FIG. 1, depicted therein is a functional block diagram of an embodiment of an apparatus 10 for mitigating the hysteresis effect in a sensing circuit 14 in accordance with an embodiment of the present invention. For purposes of illustration, the sensing circuit 14 is shown in its state model representation, wherein, in general, the sensing circuit 14 may comprise an electronic circuit having a plurality of states (i.e., a multi-state or multi-stable circuit) that is capable of evaluating one or more properties of an "external" system 12. The external system 12 itself may be provided as another electronic circuit or device under test (DUT). Although the device to be evaluated is shown as a separate block, it will be recognized that the DUT and associated sensing circuit may also be combined into a single integrated circuit, e.g., a system-on-chip (SOC) semiconductor device. Exemplary implementations include microprocessors or memory elements (collectively, "data circuits") providing data to be sensed by a data receiver interface circuit, which can be off-chip or on-chip.

The operation of the sensing circuit is triggered by a trigger signal 26 which may be provided as a periodic duty cycle associated with the sensing circuit. As an evaluator of the DUT's property (e.g., voltage, current, logic states, et cetera), the sensing circuit 14 is operable in a decision-making mode to sense a signal indicative of the property. When the sensing circuit 14 is not in the decision-making mode, its internal devices are biased in a state of equilibrium. That is, the sensing circuit as a whole is placed in a balanced state 16. The sensing operation (i.e., the evaluation process) is typically effectuated as a result of a state transition of the sensing circuit, wherein its internal devices are activated or deactivated in a predetermined fashion with appropriate bias so that the circuit is driven to one or more unbalanced states 18-1 through 18-N.

To minimize the amount of time the sensing circuit resides in an unbalanced state for evaluation purposes (which gives rise to the hysteresis effect due to accumulation of unequalized offsets in the physical properties of the circuit device materials over time), a monitoring element and feedback generator block 22 is advantageously provided that is capable of restoring the sensing circuit's initial balanced state immediately upon detecting the completion of an evaluation cycle. A feedback control signal 24 is accordingly generated by the generator block 22 upon detecting a transition by the sensing circuit from its balanced state to an unbalanced state. Further, the monitoring functionality of the apparatus 10 is also operable to interface with a storage element 20 to control the storing of indicia relating to the evaluation performed by the sensing circuit 14 as a measurement of the property. Such measurements may be provided to other circuitry as data 28 for further operations.

Figure 2:
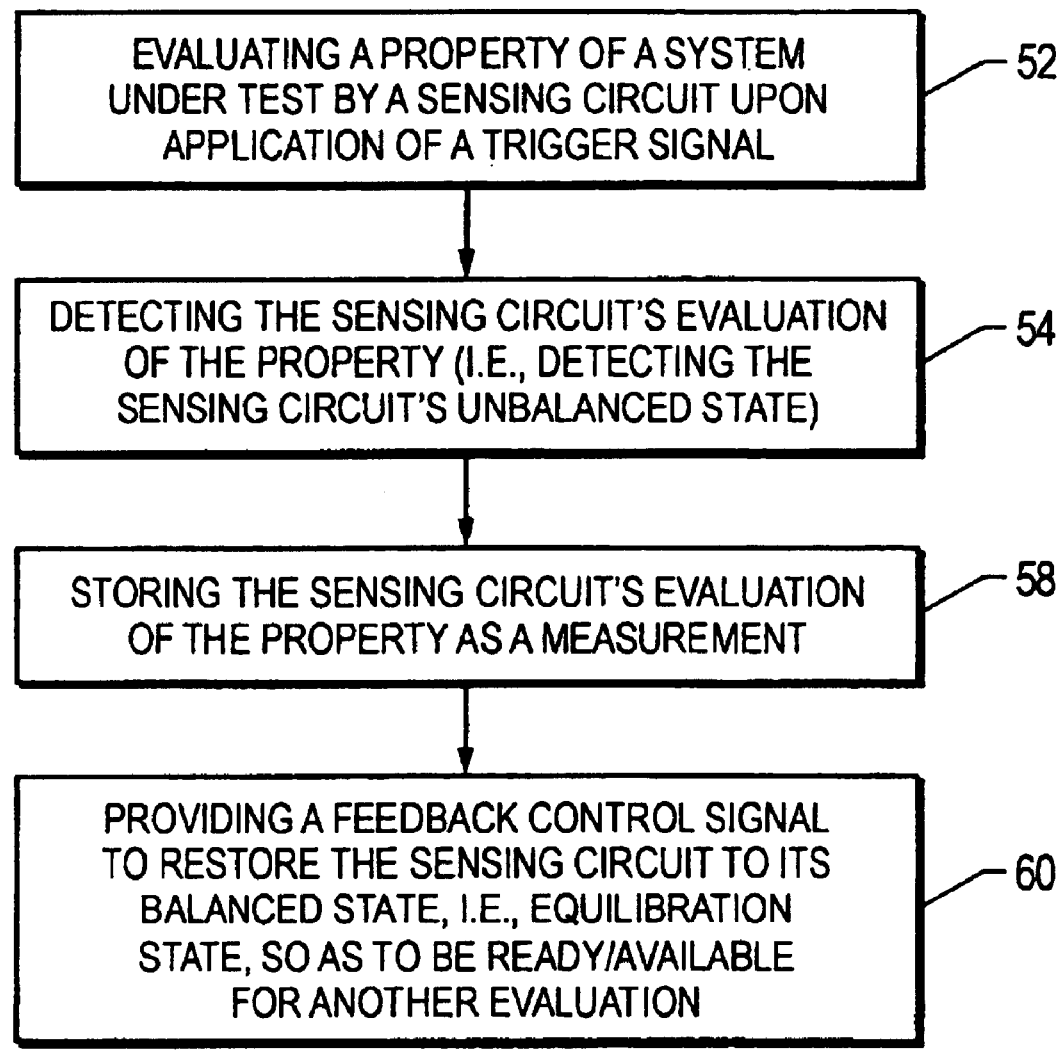
FIG. 2 is a flow chart of the various operations involved in an embodiment of a method for mitigating the hysteresis effect in a sensing circuit in accordance with an embodiment of the present invention.

FIG. 2 is a flow chart of the various operations involved in a method for mitigating the hysteresis effect in a sensing circuit in accordance with an embodiment of the present invention. Upon application of a trigger signal (e.g., a clock edge), the sensing circuit is transitioned into an unbalanced state pursuant to conducting an evaluation of a system's property (block 52). The sensing circuit's evaluation process or decision-making process is accordingly detected by monitoring the state transition (block 54). At block 60, a feedback control signal is generated thereafter, substantially immediately upon completion of the evaluation process, which control signal is provided to the sensing circuit in order to restore its balanced state so that it is ready for another evaluation cycle. In a further embodiment, the property evaluated by the sensing circuit may be stored in a storage element (e.g., flip-flops, latches, registers, et cetera) as a measurement thereof (block 58).

As alluded to hereinabove, any electronic circuit having one or more states of functional behavior wherein a sensing operation involves state transitions may be provided as a sensing circuit for purposes of the present patent application. Such circuits include, for example, op amps, sense amplifiers, comparators, Schmitt triggers, one-hot detectors, and the like, and may be fabricated using any known semiconductor device technologies. For purposes of elucidation of the broad inventive concepts set forth above, a particular type of electronic circuit, i.e., data receiver interface circuit fabricated with silicon-on-insulator (SOI) process technology, will be exemplified hereinbelow.

It is well known that several semiconductor manufacturers are exploring the possibility of utilizing SOI fabrication techniques for advanced value-added products such as microprocessors because at current submicron design rules and beyond the SOI process offers significant advantages over bulk silicon processes widely in use today. Typically, SOI circuits can deliver a 20% performance gain by running at faster speeds because SOI effectively eliminates junction capacitance. Further, as noise margins are improved, signal sensitivity is also enhanced considerably in SOI-based circuitry.

SOI insulates transistors by building them on a silicon film atop a buried layer of oxide ($SiO_2$) across an entire wafer. An SOI device is thus insulated on all directions by oxide, on the right and left by shallow trench isolation and on the bottom by the buried-oxide layer in the SOI wafer. The active area of the transistor is a very small silicon volume that is said to "float" because it is not directly connected to anything. Accordingly, lacking an ohmic contact to ground, the potential floats between the top layer and the buried oxide. And with limited connections through source and drain, but no direct contact, the body voltage can change, giving rise to the floating-body or body bias effect, as well as a number of other issues, such as changes in the breakdown voltage, variable threshold voltages, etc. Further, SOI transistors exhibit what is known as the "history effect," where the body bias accumulates over time and deteriorates the device switching speed to unacceptable levels, as the SOI circuitry is operated disproportionally in an unbalanced state in its duty cycle.

It should be appreciated by one skilled in the art that these negative "side effects" are particularly detrimental in high-speed data receiver circuitry where sense amplifier and latch circuits are implemented for sensing data provided by off-chip input/output (I/O) circuitry. Current solutions that address these issues, such as implementing a separate body contact, are expensive and not entirely satisfactory. Accordingly, a scheme is provided in accordance with an embodiment of the present invention as set forth hereinbelow wherein residency of an SOI sensing circuit in the unbalanced state portion of its duty cycle is advantageously minimized.

Figure 3:
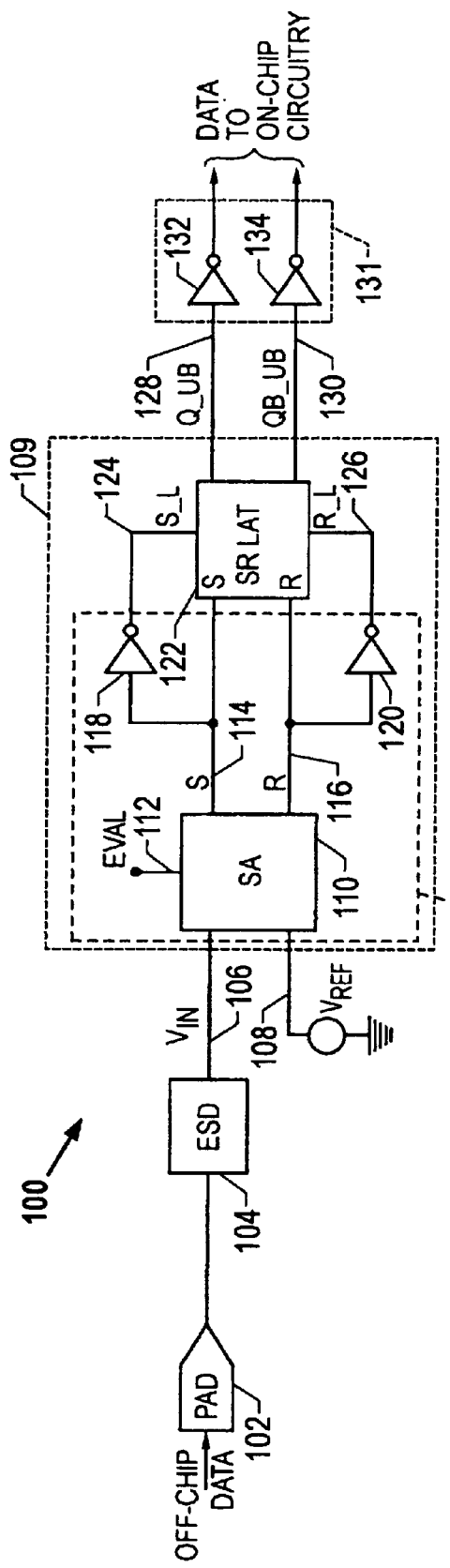
FIG. 3 depicts a functional schematic diagram of an embodiment of a silicon-on-insulator (SOI)-based data receiver interface circuit having a sense amplifier (sense amp) latch arrangement wherein the hysteresis effect caused by transistor back bias is mitigated.

Referring now to FIG. 3, shown therein is a functional schematic diagram of an embodiment of an SOI-based data interface circuit 100 having a sense amplifier latch (SAL) circuit portion 109 that in turn includes a sensing circuit portion 121 and a data storage portion 122. In one implementation, the data interface circuit 100 is operable as a single-ended, off-chip signal receiver disposed on a Very Large Scale Integration (VLSI) component such as, e.g., a microprocessor chip that is fabricated using an appropriate SOI design and process. Off-chip data input/output (I/O) circuitry (not shown) is operable to provide off-chip data signals (which may be implemented as open-drain data signals capable of a voltage swing of about +400 mV) to a pad 102 associated with the interface circuit 100. An electrostatic discharge (ESD) protection block 104 may be included for providing appropriate ESD isolation to the data signals.

The SAL circuit portion 109 is operable to receive the data signal as a VIN signal 106. A reference voltage, VREF, 108 is also provided as an input to the SAL circuit portion 109. As will be described in greater detail hereinbelow, a sense amp (SA) 110 included in the sensing circuit portion 121 is operable to sense the data based on the differential between VIN and VREF, responsive to a feedback control signal 112 (hereinafter referred to as EVAL) that is used to alternate the sense amp's operation between an evaluation phase (where the data is sensed when the circuit is an unbalanced state) and an equilibration phase (where the internal nodes of the sense amp are pre-charged to a balanced state). A pair of complementary data signals, S and R (reference numerals 114 and 116, respectively), are generated by the SA 110 which are provided to a set-reset (S-R) latch (SRLAT) operating as the data storage element 122 for latching the data. Inverter 118 and inverter 120 are operable to invert the data signals S and R, respectively, so as to generate inverted data signals, S_L 124 and R_L 126, which are also provided to SRLAT 122. Unbuffered data signals, Q_UB 128 and QB_UB 130, are generated by SRLAT 122 responsive to the complementary data signals 114, 166 and the inverted signals 124, 126 derived therefrom. A buffering stage 131 may be provided so as to buffer the levels of the data signals before they are propagated to appropriate on-chip circuitry for subsequent use. In one implementation, the buffering stage 131 comprises inverters 132 and 134 for buffering Q_UB 128 and QB_UB 130, respectively.

Figure 4:
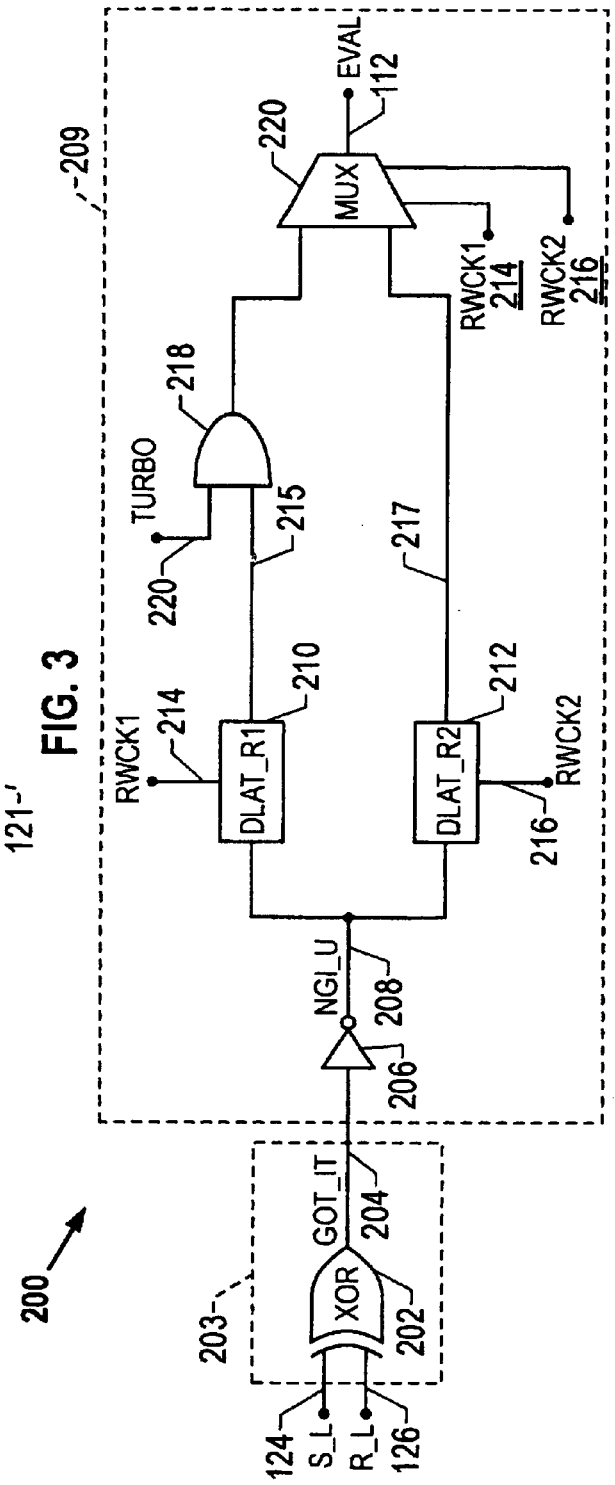
FIG. 4 depicts a functional schematic diagram of an embodiment of a state monitoring and feedback generator circuit for effectuating sense amp evaluation and equilibration phases from the same clock edge.

FIG. 4 depicts a functional schematic diagram of an embodiment of a state monitoring and feedback generator circuit 200 for effectuating sense amp evaluation and equilibration phases from the same clock edge whereby the sensing circuit portion 121 is restored to its balanced state as quickly as possible upon sensing data. A state monitoring portion 203 comprising an exclusive-OR (XOR) gate 202 is operable to receive the inverted data signals S_L 124 and R_L 126 from the SAL circuit portion 109 and generate a GOT_IT signal 204 when the inputs are either [1, 0] or [0, 1]. An inverter 206 inverts the GOT_IT signal 204 to generate NGI_U signal 208, which is provided to a feedback control generator portion 209. Two zero catcher circuits, DLAT_R1 210 and DLAT_R2 212, are included in the feedback control generator portion, each of which is operable to capture a high-to-low transition that signifies substantial completion of a data sense operation by the sense amp within a particular clock phase of one of the two clocks providing timing to the interface circuitry. In FIG. 4, a first clock signal (RWCK1) 214 and a second clock signal (RWCK2) 216, which may be provided to be complementary, that is, out-of-phase, with respect to each other, are used to clock DLAT_R1 210 and DLAT_R2 212, respectively. As will be described in greater detail below, the zero catcher circuits operate to generate a logic low signal when a data sense operation in the evaluation phase of the sense amp is substantially complete, which logic low signal is thereafter propagated via a multiplexer (MUX) 220 to modify the logic state of the control signal 112. Reference numerals 215 and 217 refer to two signals, GOT_IT_C1 and GOT_IT_C2, generated by the zero catcher circuits that are driven low depending on which of the clocks is in a logic high state, when NGI_U 208 is low. Thus, when one of the trigger clocks is in phase (i.e., driven high) to start the evaluation phase of the SA, upon substantially completing the ensuing data sense operation, the EVAL control signal 112 will be driven low so that the evaluation phase is shut down and the equilibration phase is initiated while the clock is still high. In other words, the rising edge of the activated clock (RWCK1 or RWCK2) triggers the evaluation and, subsequently, the equilibration phase is entered combinationally off the evaluation phase by means of the self-timed loop effectuated by the feedback control generator portion 209 in association with the detector circuit portion. The same clock edge is operable, accordingly, to trigger both evaluation and equilibration phases of the SA operation. Further, where the clocks are complementary, there can be two rising edges for one full clock cycle, giving rise to what may be referred to as the dual edge-triggered operation of the data interface circuitry.

In one embodiment, the effect of either of the zero catcher circuits, therefore either of the two complementary clocks, may be disabled by appropriate logic, whereby only a single edge-triggered operation may be effectuated. In the feedback control generator circuit portion 209 shown in FIG. 4, an AND gate 218 is operable to AND the GOT_IT_C1 215 with a turbo signal 220, whose output is provided to the MUX 220. If the dual edge-triggered operation is not desired, accordingly, the turbo signal 220 is set to logic 0, thereby keeping the SA 110 in the equilibration phase throughout the RWCK1=logic 0, RWCK2=logic 1 phase of the clock cycle.

Figure 5:
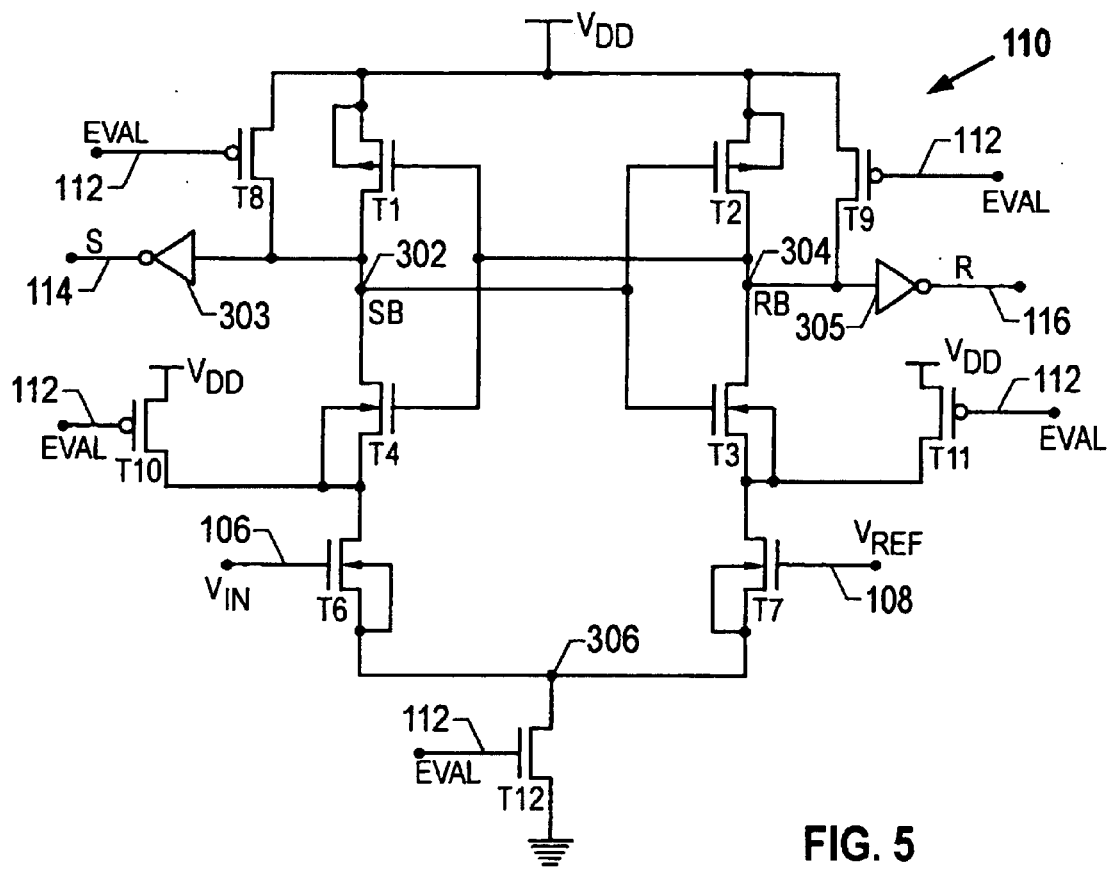
FIG. 5 depicts a circuit diagram of a sense amp circuit embodiment for use with the arrangement shown in FIG. 3.

Referring now to FIG. 5, depicted therein is a circuit diagram of a sense amp embodiment, e.g., SA 110, for use with the SAL circuit arrangement shown in FIG. 3. Two PMOS transistors T1 and T2, and two NMOS transistors T3 and T4 are arranged together as a pair of cross-coupled inverters, wherein nodes SB 302 and RB 304 refer to a pair of complementary data nodes formed therein. Transistors T8/T10 and T9/T11, each device being switched on or off by EVAL 112, are provided for pre-charging and balancing the data nodes 302 and 304, respectively, during the equilibration phase. Inverters 303 and 305 are operable to invert the logic levels of the data nodes so as to generate a pair of complementary data signals, S 114 and R 116, respectively. The input data signal (VIN) 106 and the reference signal (VREF) 108 are gated to NMOS devices T6 and T7, respectively. Node 306 is operable to be driven low when EVAL 112 turns transistor T12 on during the evaluation phase.

Figure 6:
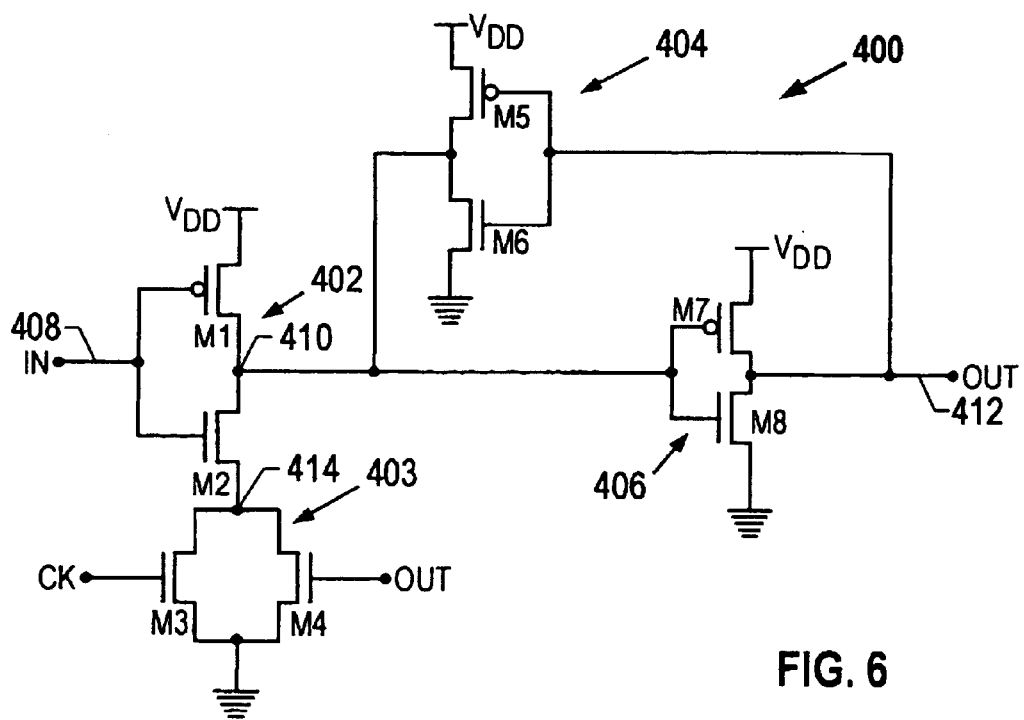
FIG. 6 depicts a dynamic latch circuit embodiment for capturing high-to-low transitions, which dynamic latch circuit may be used advantageously in the feedback generator circuit of FIG. 4.
Figure 7A:
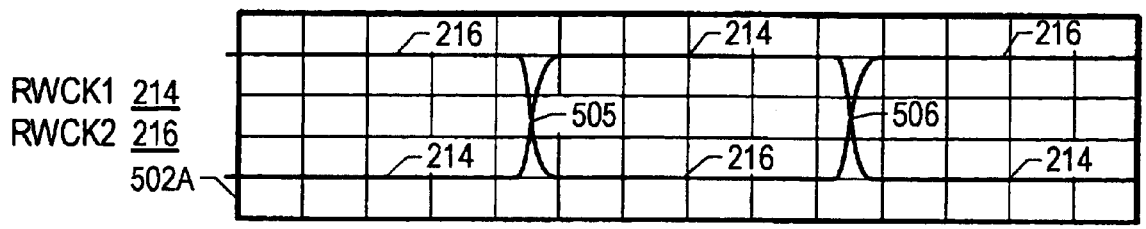
FIGS. 7A–7D depict a plurality of timing diagram panels that illustrate the various signals used for effectuating the dual edge-triggered operation of the sense amp latch arrangement.
Figure 7B:
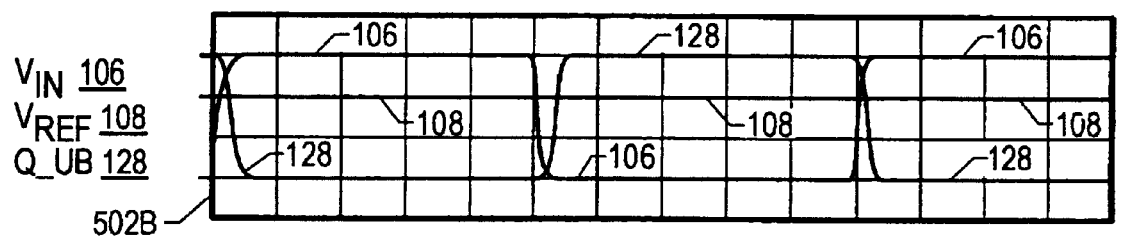
Figure 7C:
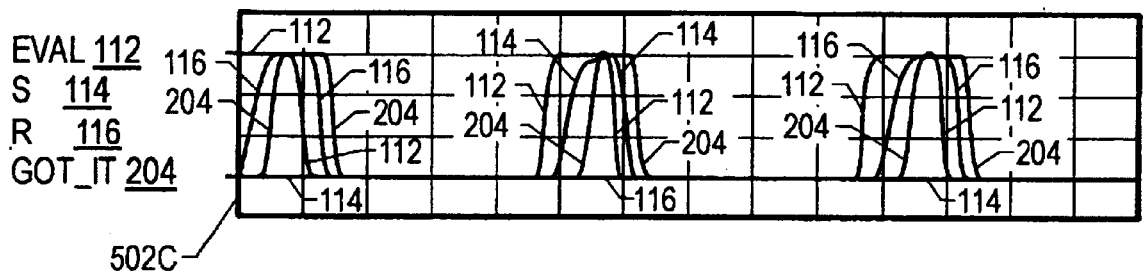
Figure 7D:
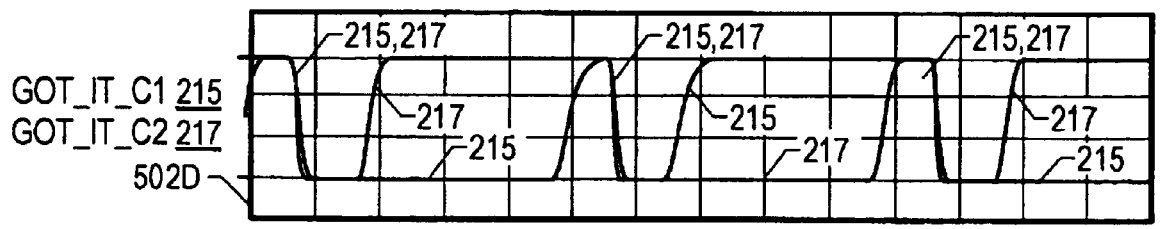

FIG. 6 depicts a dynamic latch circuit embodiment 400 for capturing high-to-low transitions, which dynamic latch circuit may be advantageously used as a zero catcher in the feedback control generator circuit 209 shown in FIG. 4. In one hardware realization, the dynamic latch 400 is comprised of a circuit arrangement with three inverters 402, 404 and 406 that provides for noise-resistant capture of a high-to-low transition on an input signal 408 when a CK signal is in a logic low state. Transistors M1 and M2 are operable to form the inverter 402 whose output 410 is provided as an input to the inverter 406 comprising transistors M7 and M8. The inverter 404, which comprises transistors M5 and M6, is cross-coupled to the inverter 406, wherein node 412 is operable to provide the output signal. Transistors M3 and M4 of a pulldown circuit portion 403 operate to drive an internal node 414 low when they are turned on. When the input signal 408 and CK 409 are high, node 410 is driven low, which is quickly propagated as a logic high on the output 412 due to the regenerative feedback relationship of the inverters 404 and 406. When CK 409 is low, a high-to-low transition on the input signal 408 drives node 410 high, that appears as a logic low on the output 412.

In light of the foregoing detailed description of the data receiver interface circuitry and its constituent circuit portions, the general operation thereof will now be set forth as follows by taking reference to FIGS. 3–6 as necessary. Initially, the data receiver interface circuitry 100 is at rest, where turbo=1, RWCK1=0, RWCK2=1, GOT_IT_C1=0, GOT_IT_C2=1, and EVAL=0. At this point, SA 110 (FIG. 5) is in equilibration phase where all internal nodes of the SA are in a balanced state and SB and RB nodes are precharged. Thus, the data signals S and R are driven low, which implies that their inverted signals S_L and R_L are driven high (i.e., [1, 1] state).

Upon the clock transition RWCK1=1 and RWCK2=0 (i.e., the first clock is in phase), EVAL 112 is driven high which causes the SA to enter its evaluation phase. When data input VIN is at a higher voltage than VREF, SB node 302 in SA 110 is preferentially driven low because the pull-down device T12 is on. Regenerative feedback (i.e., positive feedback) within the SA ensures that the complementary RB node 304 is quickly driven to a logic high state. As a result, data signal (S) 114 goes high while its complementary signal (R) remains low.

With S=1 and R=0, SRLAT 122 transitions into a SET state. This results in Q_UB 128 transitioning into a logic high state while its complement (QB_UB) 130 goes low. In the meantime, the inverted data signals (S_L and R_L) transition from the [1, 1] state into a [0, 1] state, which is detected by the XOR gate 202 (FIG. 4). Subsequently, GOT_IT 204 is driven high, which then is inverted by inverter 206 to drive NGI_U 208 to a logic low state.

As NGI_U 208 transitions from 1 to 0, it triggers the zero catcher circuit DLAT_R2 212 (because RWCK2 is low), driving GOT_IT_C2 217 to a logic low state. This logic low is propagated through MUX 220, resulting in EVAL 112 being pulled low. In response, the evaluation phase of the SA is shut down and the equilibration operation ensues thereafter. Accordingly, those skilled in the art should appreciate that a self-timed loop is effectuated for bringing the SA out of its evaluation phase as the data sensing operation is substantially completed upon the occurrence of a rising clock edge. Further, because the SA is allowed to spend only a minimal amount of time (necessary to drive the data nodes to appropriate logic levels) in its imbalanced evaluation phase, device mismatching due to accumulated body bias in the SOI devices is advantageously reduced.

Once the SA is brought into its equilibration phase following the evaluation phase (because of the EVAL control signal 112 driven low by the self-timed feedback loop circuitry), the internal SB and RB nodes are pulled high due to pre-charging. Both S and R data signals 114, 116 are driven low, which drives the SR latch 122 into a HOLD state. Substantially at the same time, the inverted S_L and R_L signals 124, 126 transition into a [1, 1] state, resulting in GOT_IT 204 being driven low. Consequently, the NGI_U signal 208 is driven high.

Since the clock input (i.e., RWCK2) to the zero catcher circuit (DLAT_R2) 212 is still low, GOT_IT_C2 217 remains in logic 0 condition, thereby ensuring that EVAL 122 is continuously held low. Thus, with both NGI_U 208 and RWCK1 214 being high, GOT_IT_C1 215 is driven high in preparation for the next clock transition (i.e., in RWCK2 216).

Upon the clock transition, whereby RWCK2 transitions into a logic high state (i.e., the clock is in phase) and RWCK1 transitions into a logic low state (out of phase), the SAL circuit portion repeats the same steps of data sensing in its evaluation phase as set forth above. Correspondingly, the S_L and R_L inputs to the feedback circuitry change to a [1, 0] or [0, 1] state (depending on the next data value being sensed), which transition is propagated therethrough to shut down the evaluation phase and thereby commence the next equilibration phase. The DLAT_R1 zero catcher circuit 210 is activated in this clock phase and, accordingly, the roles of GOT_IT_C1 215 and GOT_IT_C2 217 are reversed. As alluded to hereinabove, if the dual edge-triggered operation is not desired, the turbo signal 220 can be tied low, thereby keeping the SA in the equilibration phase throughout the clock phase where RWCK1=0 and RWCK2=1.

Referring now to FIGS. 7A–7D, depicted therein are a plurality of timing drawing panels that illustrate waveforms of the various signals used for effectuating the dual edge-triggered operation of the SAL arrangement described above. It should be recognized by those skilled in the art that the timing relationships shown for the signals are essentially graphical renditions of the relationships described in detail hereinabove. Accordingly, only some of the salient features relating to the signals are particularly set forth immediately below.

Panel 502A depicts the two complementary clock signals, RWCK1 214 and RWCK2, where each clock is in phase (i.e., in a logic high state) for half of the cycle. Panel 502B depicts the relationship among VIN 106, VREF 108 and Q_UB 128. Panel 502C depicts EVAL 112, complementary S and R data signals 114 and 116, and GOT_IT signal 204. With particular reference to the clock crossover 505, where RWCK1 becomes 1 and RWCK2 becomes 0, as EVAL 112 goes high, the complementary S and R data signals are pulled apart (S being driven high and R being driven low), because VIN is greater than VREF. The GOT_IT signal 204, which captures the transition in the S_L and R_L signals by means of the XOR gate, is driven high thereafter. Although VIN 106 is driven low shortly thereafter, the receiver circuitry is fast enough to latch the correct data. The EVAL signal 112 is then pulled low to shut down the evaluation phase. While RWCK1 214 is still high, the SA enters the equilibration phase for the remainder of the clock phase. Similarly, with respect to the clock crossover 506, where VIN<VREF and RWCK2 is driven high, EVAL 112 is driven high which results now in R signal 116 being pulled to a logic high state and its complementary S signal 114 being pulled to ground. Panel 502D depicts the relationship between the zero catcher outputs, GOT_IT_C1 215 and GOT_IT_C2 217, that control the logic state of the EVAL signal 112 during the self-timed feedback loop operation for shutting off the evaluation phase.

Figure 8:
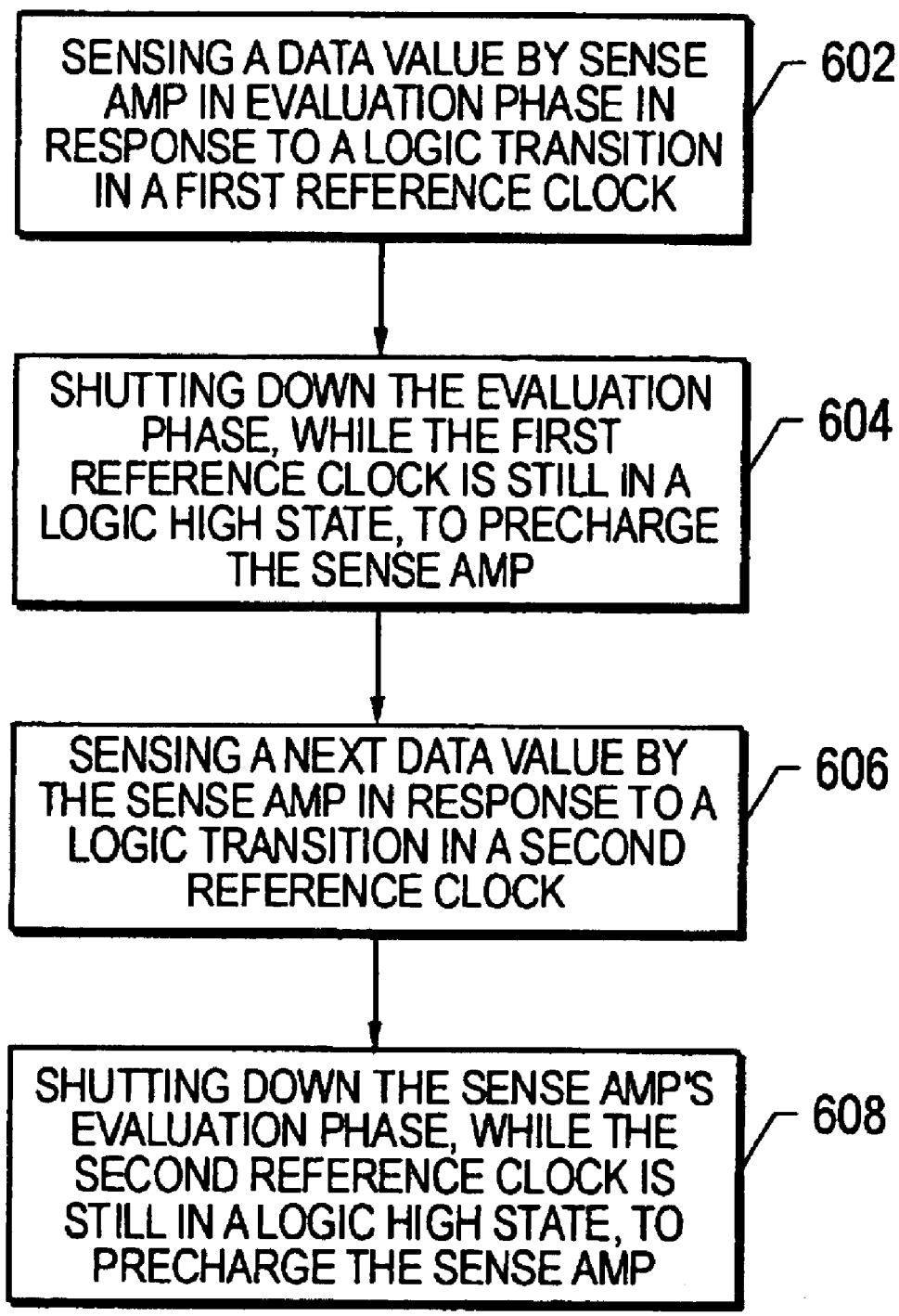
FIG. 8 is a flow chart of the various operations involved in a dual edge-triggered data sense operation of the sense amp circuitry shown in FIG. 3, wherein the hysteresis effect is advantageously mitigated.

FIG. 8 is a flow chart of the various operations involved in the dual edge-triggered data sense operation of the sense amp circuitry shown in FIG. 3, wherein the hysteresis effect is advantageously mitigated. Upon sensing a data value by a sense amp in its evaluation phase in response to a logic transition in a first reference clock (block 602), a self-timed feedback loop path is employed for shutting down the evaluation phase while the first clock is still in the transitioned state (e.g., logic high state) (block 604). Upon shutting down the evaluation phase, the SA enters an equilibration phase for pre-charging its internal nodes. Thereafter, a next data value is sensed when a logic transition is encountered in a second reference clock (block 606). The self-timed feedback loop path is operable to detect substantial completion of the data sense operation in the second clock phase, whereupon the SA's evaluation phase is shut down again while the second clock is still in the transitioned state (i.e., logic high state) as shown at block 608.

It is believed that the operation and construction of the embodiments of the present invention will be apparent from the foregoing Detailed Description. The various embodiments of the circuitry, apparatus and method of the present invention shown and described are illustrative only. Accordingly, it should be readily understood that numerous changes and modifications could be made therein (e.g., in the implementation of various logic gates and generation of the clock signals necessary to achieve the functionality of the self-timed shutdown mechanism set forth above, or regarding the type of SOI process used or the particular design application, et cetera) without departing from the scope of the present invention as set forth in the following claims.

What is claimed is:

1. A method for mitigating the hysteresis effect associated with a sensing circuit's operation, said sensing circuit having a plurality of states, comprising:

evaluating a property of a system under test by said sensing circuit upon application of a trigger signal;

detecting said sensing circuit's evaluation of said property of said system under test; and providing a feedback control signal to restore said sensing circuit to an initial state so as to be available for another evaluation.

2. The method for mitigating the hysteresis effect associated with a sensing circuit's operation as set forth in claim 1, further comprising the operation of storing a measurement relating to said property based on said sensing circuit's evaluation.

3. The method for mitigating the hysteresis effect associated with a sensing circuit's operation as set forth in claim 1, wherein said sensing circuit's initial state comprises a balanced state.

4. The method for mitigating the hysteresis effect associated with a sensing circuit's operation as set forth in claim 3, wherein said sensing circuit transitions from said balanced state to an unbalanced state pursuant to evaluating said property of said system under test.

5. The method for mitigating the hysteresis effect associated with a sensing circuit's operation as set forth in claim 1, wherein said system under test comprises a microprocessor and said sensing circuit is operable to evaluate data signals provided by said microprocessor.

6. The method for mitigating the hysteresis effect associated with a sensing circuit's operation as set forth in claim 5, wherein said microprocessor and said sensing circuit are integrated into a system-on-chip (SOC) device.

7. The method for mitigating the hysteresis effect associated with a sensing circuit's operation as set forth in claim 1, wherein said feedback control signal is provided to said sensing circuit substantially immediately upon said detecting operation.

8. A method for mitigating the hysteresis effect in a sensing circuit operable to sense data generated by a data circuit, comprising:

sensing, by said sensing circuit, of said data generated by said data circuit in response to a control signal's logic state, said control signal operating to toggle said sensing circuit's state between a balanced state and an unbalanced state; and restoring said sensing circuit's state to said balanced state responsive to said control signal's logic state upon completing said sensing operation.

9. The method for mitigating the hysteresis effect in a sensing circuit as set forth in claim 8, wherein said control signal's logic state is modified substantially immediately upon detecting that said sensing operation is complete.

10. The method for mitigating the hysteresis effect in a sensing circuit as set forth in claim 8, wherein said sensing is performed by said sensing circuit operable as a sense amplifier (sense amp) comprising a plurality of silicon-on-insulator (SOI) transistors.

11. The method for mitigating the hysteresis effect in a sensing circuit as set forth in claim 10, wherein said control signal is generated by a feedback control generator having a pair of zero catcher circuits operating in a complementary fashion.

12. An apparatus for mitigating the hysteresis effect associated with a sensing circuit's operation, said sensing circuit having a plurality of states, comprising:

a state monitor circuit operable to detect said sensing circuit's state upon evaluating a property of a system under test by said sensing circuit; and a feedback control generator coupled to said state monitor circuit for generating a control signal operable to transition said sensing circuit's state to a balanced state, wherein said control signal's logic state is modified substantially immediately upon completion of said evaluating operation.

13. The apparatus for mitigating the hysteresis effect associated with a sensing circuit's operation as set forth in claim 12, wherein said state monitor circuit is operable to detect said sensing circuit's state transition from a balanced state to an unbalanced state pursuant to evaluating said property of said system under test.

14. The apparatus for mitigating the hysteresis effect associated with a sensing circuit's operation as set forth in claim 12, wherein said system under test comprises a data circuit portion operable to provide data out signals and said sensing circuit comprises a sense amplifier (sense amp) is operable to evaluate said data out signals.

15. The apparatus for mitigating the hysteresis effect associated with a sensing circuit's operation as set forth in claim 14, wherein said sense amp comprises a plurality of silicon-on-insulator (SOI) transistors operating to generate a pair of inverted data signals upon evaluating a data out signal.

16. The apparatus for mitigating the hysteresis effect associated with a sensing circuit's operation as set forth in claim 15, wherein said state monitor circuit comprises an exclusive-OR (XOR) gate operating responsive to said pair of inverted data signals and said feedback control generator comprises a pair of zero catcher circuits operating in a complementary fashion, said zero catcher circuits operating to drive a multiplexer for propagating a particular logic state on said control signal.

17. The apparatus for mitigating the hysteresis effect associated with a sensing circuit's operation as set forth in claim 16, wherein said state monitor circuit and said feedback control generator are fabricated using silicon-on-insulator (SOI) devices.

18. The apparatus for mitigating the hysteresis effect associated with a sensing circuit's operation as set forth in claim 17, wherein said data circuit portion comprises 2 microprocessor.

19. The apparatus for mitigating the hysteresis effect associated with a sensing circuit's operation as set forth in claim 17, wherein said data circuit portion comprises a memory element.

* * * * *